United States Patent [19]

Mahrla

[11] Patent Number: 4,686,557
[45] Date of Patent: Aug. 11, 1987

[54] SEMICONDUCTOR ELEMENT AND METHOD FOR PRODUCING THE SAME

[75] Inventor: Peter Mahrla, Munich, Fed. Rep. of Germany

[73] Assignee: Siemens Aktiengesellschaft, Berlin and Munich, Fed. Rep. of Germany

[21] Appl. No.: 687,201

[22] Filed: Dec. 28, 1984

Related U.S. Application Data

[62] Division of Ser. No. 290,332, Aug. 5, 1981, Pat. No. 4,511,912.

[51] Int. Cl.⁴ .................... H01L 29/72; H01L 27/02; H01L 29/06
[52] U.S. Cl. ........................................ 357/34; 357/36; 357/51; 357/20
[58] Field of Search ............... 357/34, 51, 20, 36

[56] References Cited

U.S. PATENT DOCUMENTS

| | | | |
|---|---|---|---|
| 3,665,266 | 5/1972 | Drozdowicz et al. | 357/34 |
| 3,858,234 | 12/1974 | Olson | 357/51 |
| 4,486,770 | 12/1984 | Woodward | 357/51 |
| 4,511,912 | 4/1985 | Mahrla | 357/34 |

OTHER PUBLICATIONS

Warner, Raymond Jr., Integrated Circuits, N.Y., McGraw-Hill, ©1965, p. 29.
Murari, Bruno, "Power Integrated Circuits: Problems, Tradeoffs, and Solutions", IEEE Journal of Solid State Circuits, vol. SC-13, No. 3, pp. 307-319, Jun. 1978.

Primary Examiner—William D. Larkins
Assistant Examiner—Robert P. Limanek
Attorney, Agent, or Firm—Herbert L. Lerner; Laurence A. Greenberg

[57] ABSTRACT

Semiconductor element, including at least one bi-polar power transistor having parallel-connected transistor regions, active and contacted partial base zone regions, an emitter zone-base zone pn-junction, and base barrier resistances disposed between the active base regions at the emitter-base pn-junction and the contacted base regions, the greater part of the base current being conducted through the base barrier resistances and the voltage drop over the emitter region being small compared to the voltage between the active base region and the contacted base region.

5 Claims, 6 Drawing Figures

SEMICONDUCTOR ELEMENT AND METHOD FOR PRODUCING THE SAME

This is a division of application Ser. No. 290,332, filed Aug. 5, 1981 now U.S. Pat. No. 4,511,912.

The invention relates to a semiconductor element including at least one bi-polar power transistor, having parallel-connected transistor regions and partial base regions arranged in such a manner, that between active base regions at the emitter-base p n-junction and contacted base regions, resistances in the form of so-called base barrier resistances are provided.

During the operation of bi-polar power transistors it is of great importance, with respect to the operational reliability and life of such a component, to achieve uniform current distribution over the transistor as a whole.

Due to the negative temperature coefficient of the base-emitter voltage, a lateral thermal instability exists in bi-polar power transistors.

The following relationship approximately applies for the dependence of the collector current density $J_C$ on the temperature T and the base-emitter-voltage $U_{BE}$:

$$J_C = J_{CO} X \exp((q \cdot U_{BE} - E_g)/kT)$$

where:
$J_{CO}$ = Proportionality factor;
q = Unit Charge (elementary charge);
$E_g$ = band distance at silicone about 1.1 eV(energy level; and
k = Boltzmann constant.

If the temperature increases locally in a transistor relative to the surroundings, this results for a constant base-emitter voltage in an increase of the local current density according to the equation given above. This also leads to a local increase of the heat liberation as a power loss at the collector-base barrier layer and in the high-ohmic part of the collector. The resulting local temperature rise initiates a feedback coupling mechanism, resulting in a current restriction in the transistor. The high local heat liberation associated therewith frequently causes irreversible damage to the transistor, leading to the failure of the component.

Such excessive temperatures must be prevented by a suitable current stabilization.

It is known, from the IEEE Journal of Solid State Circuits, Vol. SC-13, Nos. 3, pages 307 to 319, June 1978, to effect a current limitation in integrated power transistors by providing that the emitter zone is divided into several regions, whereby the part functioning mainly as an emitter is not contacted in the vincinity of the base connection, but is connected with contacted regions of the emitter zone through several part regions of the emitter zone which act as barrier resistances. This is done in such a configuration that each part-region of the effective emitter zone is associated with a barrier resistance and with a connection. An uniform current distribution over the individual partial regions of the effective emitter zone is achieved by the voltage drop over these barrier resistances, whereby the positive temperature coefficient of the emitter barrier resistance assists this regulation. Furthermore, because of the transistor construction described in the hereinafore-mentioned literature, a base barrier resistance is also provided besides the emitter barrier resistance. However, the base barrier resistance plays a minor role compared to the emitter barrier resistance. Furthermore, however, the insertion of emitter barrier resistances has the consequence that besides an additional power loss at the emitter barrier resistances, there is an increase in the collector-emitter-residual and saturation voltage.

It is accordingly an object of the invention to provide a semiconductor element and method for producing the same, which overcomes the hereinafore-mentioned disadvantages of the heretofore-known devices and methods of this general type, and to provide a power transistor, which on one hand has a sufficiently uniform current distribution, and on the other hand exhibits a very low saturation and residual voltage, and has a power loss which is as low as possible.

With the foregoing and other objects in view there is provided, in accordance with the invention, a semiconductor element, comprising at least one bi-polar power transistor having parallel-connected transistor regions, active contacted partial base regions, arranged in a particular manner, an emitter region-base region pn-junction, and base barrier resistances disposed between non-contacted active base regions at the emitter-base pn-junction and the contacted base regions, the greater part of the base current being conducted through the base barrier resistances and the voltage drop over the emitter region being small compared to the voltage between the active base region and the contacted base region. This feature can be made especially advantageous in cases where the voltage between the active base region and the contacted base region is about twice as great, or greater, than the voltage drop over the emitter region.

Instead of emitter resistances between the effective emitter region and the contacted emitter region, base barrier resistances are provided between the contacted base regions and active base regions, so that the same or an analogous effect is achieved as with the emitter barrier resistances. In other words, a uniform distribution of the base current and accordingly also of the emitter current is achieved. A positive temperature coefficent of the base barrier resistances assists this measure.

By providing base barrier resistances instead of emitter barrier resistances, an additional power loss at the emitter barrier resistances as well as an increase of the collector-emitter residual voltage and saturation voltage can advantageously be avoided simultaneously.

In accordance with another feature of the invention, the base barrier resistances are zones of the same doping type as the base region connected between the contacted and active base regions. These barrier resistances can be effected by diffusions and implantations which are already contained in the manufacturing procedure used for producing the other structural components in the integrated circuit, so that no additional process steps are required.

In accordance with a further feature of the invention, the base barrier resistances are in the form of narrowed portions of the base zone between the active and contacted base regions. By this measure the barrier resistances in the base can be provided simply and without additional work expenditure.

In accordance with an added feature of the invention, the narrowed portions of the base region are generated by a suitable doping mask configuration. Thus, barrier resistances can be created by a suitable geometry of the doping-masks alone.

In accordance with an additional feature of the invention, the narrowed portions of the base region are generated by providing additional doped zones in the base zone.

In accordance with again another feature of the invention, the additional doped regions are emitter doped.

It is also advantageous if, in the manufacture of a power transistor, there is provided a method for producing a semiconductor element power transistor which comprises introducing n+-doped regions as a buried layer into a substrate, epitaxially depositing a layer above the buried layer and substrate, implanting isolation diffusions and n+- doped collector deep-diffusions in an optional sequence in the epitaxially deposited layer, subsequently introducing p-dopings as a base region and base barrier resistances into the epitaxial layer, subsequently introducing n+-dopings into the epitaxial layer as an emitter region and to effect a good contact of the collector deep-diffusions, providing contact windows and providing conductor paths for making contact.

In accordance with a concomitant mode of the invention, which comprises providing the substrate in the form of p-doped silicon, and providing the layer above the buried layer and substrate in the form of n-doped silicon. This production method is especially suited for making integrated power transistors. The doping with respect to p and n can also be reversed.

Other features which are considered as characteristic for the invention are set forth in the appended claims.

Although the invention is illustrated and described herein as embodied in a semiconductor element and method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which FIG. 1 is a fragmentary, diagrammatic, top plan view of a first embodiment of a semiconductor power transistor according to the invention;

In the following description of FIGS. 1 to 6, the same elements are designated with the same reference numbers, and for this reason the numbers explained for one figure are not explained again for all remaining figures.

Figure 1:
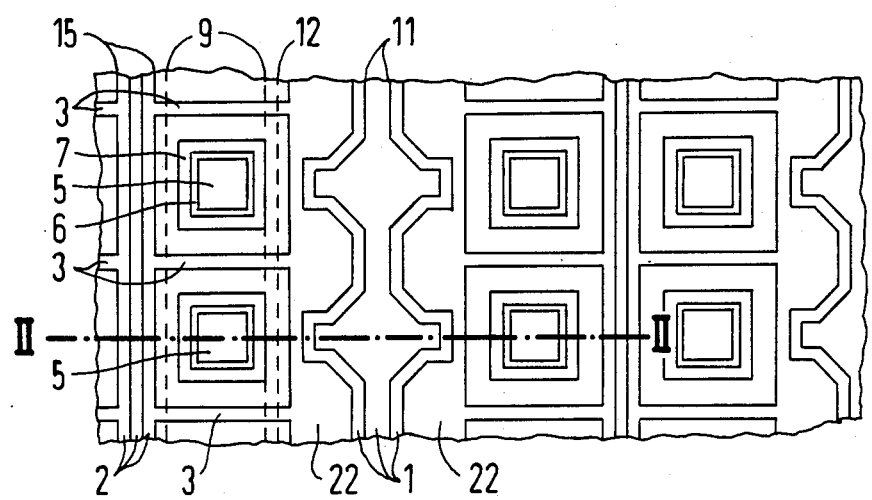
Figure 2:
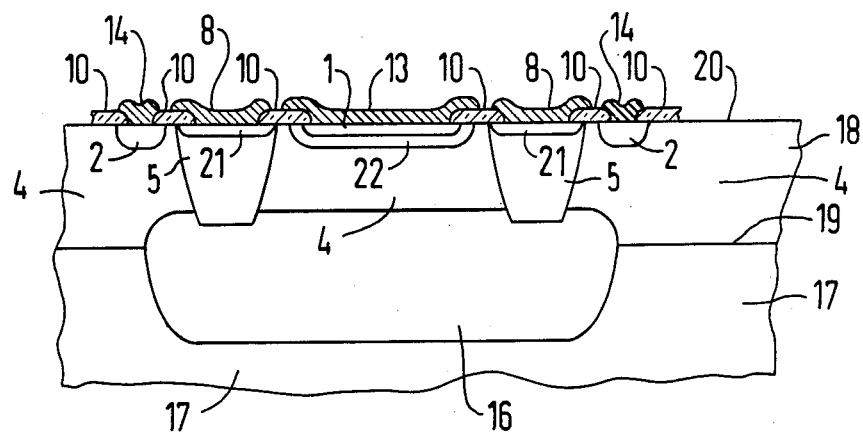
FIG. 2 is a cross-sectional view through the semiconductor power transistor according to FIG. 1, taken along the line II—II thereof.

Referring now to the figures of the drawing and first particularly to FIG. 1 thereof, there is seen a plan view onto a first embodiment of a semiconductor power transistor consisting of partial power transistors according to the invention, in integrated form. The emitter region 1 has superimposed thereon the emitter electrode 13 which is not shown in FIG. 1 for reasons of clarity. The boundary lines 12 of the emitter electrode are indicated by dotted lines. An emitter window having boundary lines 11 indicated by full lines, lies within the emitter region 1. The individual base regions 22 and 2 of which 22 is an active non-contacted base region and 2 is a contacted base region, base region are connected together by the base barrier resistances 3 in such a manner that the contacted base regions 2 are always connected with the active or non-contacted base regions 22 through the base-barrier resistances 3. The base barrier resistances 3, in the base of FIG. 1 and FIG. 2, are formed by bar-shaped, narrowed base regions. Base electrodes 14 are only indicated by boundary lines 15, for reasons of clarity. A buried layer 16 is connected by the collector-deep diffusion contact regions 5 through the collector connections 7 with the collector conducting path which is indicated by the dotted boundary lines 9.

FIG. 2 represents a cross-section of the semiconductor power transistor according to FIG. 1, wherein FIG. 1 is cut along the dotdash line II—II.

Buried layer regions 16 are doped in a substrate 17, which may be formed, for example, of saphire or a semiconductor material, especially silicon. An epitaxial layer 18 is deposited on the surface 19. The collector deep-diffusion contact regions 5 are implanted in the epitaxial layer 18 in such a way that they project downward into the buried layer 16. The collector region 4 is disposed above the buried layer 16 between the collector deep-diffusion regions 5. Above the collector region 4 is the non-contacted part 22 of the base region, which is connected with the connected base region 2 through the base barrier resistances 3 that are shown in FIG. 1. The contacting of the base region 2 is effected by the base electrode 14. The emitter region 1 is disposed within the non-contacted base region 22 and the surface 20. The emitter region 1 is contacted by the emitter electrode 13. The collector electrodes 8 are provided for contacting the collector deep-diffusion contact regions 5. For obtaining a good contact between the collector electrode 8 and the collector deep-diffusion contact region 5, additionally doped regions (collector contact regions) 21 in the collector deep-diffusion regions 5 are provided. The additionally doped regions 21 have doping which generally corresponds to the emitter doping. Oxide layers 10 which are not shown for reasons of clarity in FIGS. 1, 3 and 5 are deposited for insulation purposes between the individual transistor regions and the required conducting paths 8, 13, 14 which lie above the transistor regions.

Figure 3:
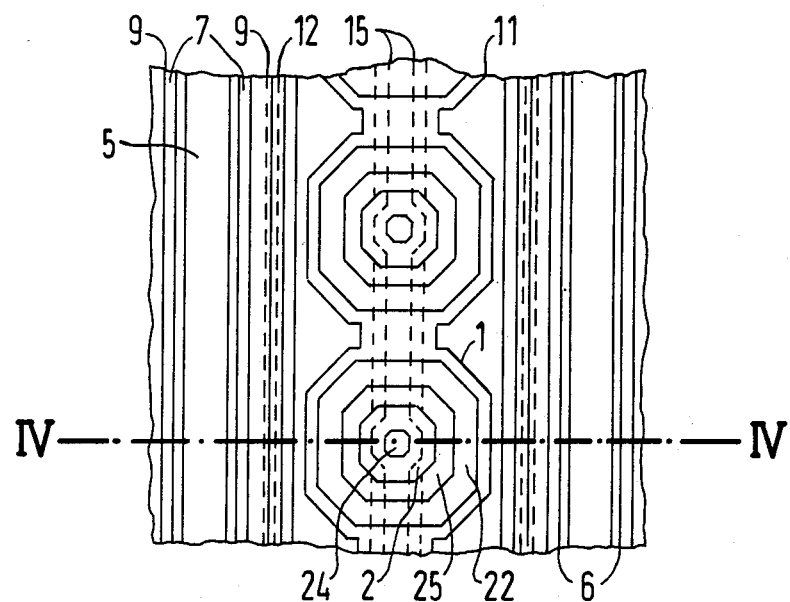
FIG. 3 is a fragmentary top plan view of a second embodiment of a semiconductor power transistor according to the invention.
Figure 4:
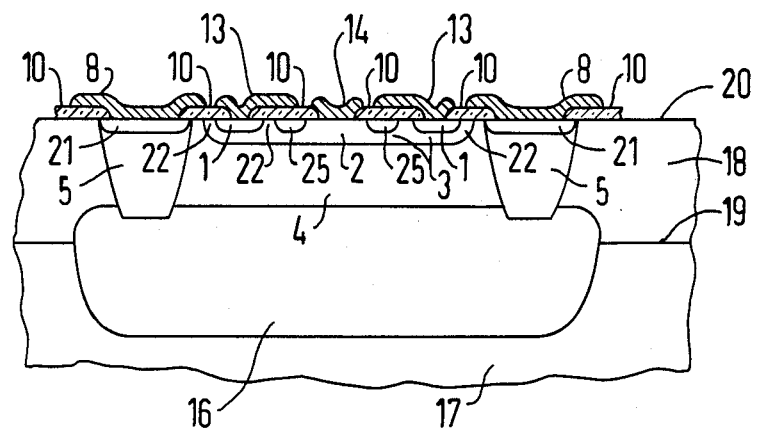
FIG. 4 is a fragmentary cross-sectional view through the semiconductor power transistor according to FIG. 3, taken along the line IV-IV thereof.

FIGS. 3 and 4 differ from FIG. 1 and FIG. 2 by the feature that the contacted base region 2 is centrally disposed, while the contacted emitter region 1 surrounds the region 2 like a ring. A ring-shaped barrier region 25 is disposed between the contacted emitter region 1 and the contacted base barrier region 2. The region 25 generally has the same doping as the emitter, however it is not connected, to any other part as shown in FIG. 3 and FIG. 4, or it can be connected to the base potential. The base region is narrowed by the annular ring-shaped barrier region 25. In this embodiment the base barrier resistances 3 are provided by the narrowed base regions 2 below the ring-shaped barrier region 25. The base resistances 3, which in this arrangement are called base-pinch resistances, have an area resistance of about 5 kilo-ohm/square.

Figure 5:
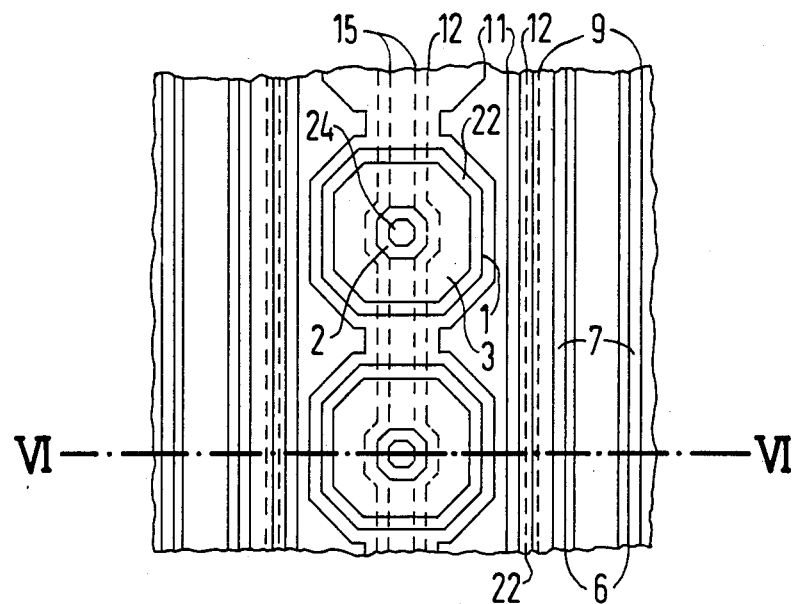
FIG. 5 is a plan view of a third embodiment of a semiconductor power transistor according to the invention.
Figure 6:
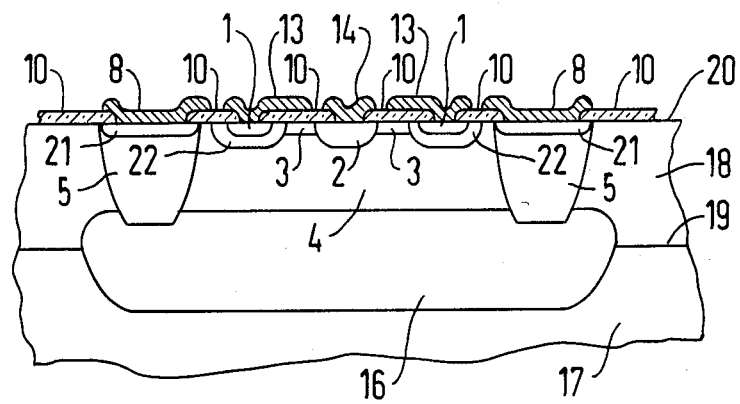
FIG. 6 is a fragmentary cross-sectional view through the semiconductor power transistor according to FIG. 5 taken along the line VI—VI thereof.

The typical embodiment according to FIG. 5 and FIG. 6 represents a transistor with a centrally disposed contact-connected base region 2, which is surrounded in ring-fashion by the annular emitter region 1. In this way the emitter region 1 is surrounded by a semi-toroid-shaped non-contact-connected base zone 22. The non-contacted base zone 22 completely surrounding the emitter region 1 and the contacted base region 2 are connected to each other by the annular disc-shaped barrier resistances 3, embedded in the upper surface of the collector region 4 which in this case are disposed in ring-fashion between the contacted base region 2 and the non-contacted base region 22. The barrier resistances 3 represent high-ohmic resistances of 2 kilo-ohm/square.

The reference numerals of FIGS. 1, 3 and 5 are given at one side of the axis of symmetry of the devices, in order not to confuse them with the associated conducting path boundary lines.

Silicon may be used as the semiconductor material for all three embodiments, and in this case the substrate 17 is, for example, p-doped, and the buried layer 16 is n+-doped, just as the regions 21 which serve for connecting the collector deep-diffusion regions 5 to the collector conducting paths 8 are doped n+. The collector 4, and also the whole epitaxial layer 18 are n -doped, the base regions 2, 22 and the base barrier resistances 3 are all p -doped. In the case of FIG. 6, the base barrier resistances 3 are made as implanted high-ohmic resistances. The emitter region 1, as well as the region 25 in FIG. 3 and FIG. 4 are n+-doped. In general, the p -doping can be effected by doping with boron, while the n and the n+ doping can be done by arsenic. However, other suitable doping means or semiconductor materials can also be used. Furthermore, the doping of the semiconductor power transistor according to the invention can also be effected by a mirror-like inversion with respect to the p and n -doping.

By using the base barrier resistances for current stabilization, the voltage drop along the base barrier resistances occurs not at the collector-emitter saturation voltage, but only at the control voltage between base and emitter connection. Through the use of base barrier resistances, disadvantageous positive temperature coefficients on the current amplification can be partly compensated in particular by the positive temperature coefficient of the base-resistance. A particularly strong temperature compensation is made possible by the use of base-pinch resistances, as shown in FIG. 3 and FIG. 4, because their positive temperatures coefficient in wide ranges lies clearly above the temperature coefficient of the current amplification. In this way, a temperature stabilization in the power transistor is additionally achieved, because at the hot places the collector current density and accordingly the liberation of heat is reduced by the increased pinch resistance.

The same structure can be provided in discrete power transistors, as shown in FIGS. 3 and 4, whereby the collector deep-diffusions are omitted.

The embodiment according to FIG. 5 and FIG. 6 also effects a compensation of the temperature coefficients of the associated current amplification because of the positive temperature coefficient of the implanted high-ohmic resistances. The structures according to FIG. 4 and FIG. 5 can also be realized in principle in doubly diffused discrete power transistors.

Semiconductor power transistors according to the invention can be especially advantageous for applications in the low frequency domain.

There are claimed:

1. Integrated bipolar power transistor arrangement including a plurality of parallel connected bipolar partial power transistors comprising: an epitaxial layer provided on a semiconductor substrate and forming contact connected collector regions for said partial power transistors, a buried layer region for said collector regions provided at the interface between said semiconductor substrate and said epitaxial layer; deep diffused collector contact regions projecting downward from the surface facing away from the substrate of the epitaxial layer into the buried layer, the contact connected collector region having an upper surface and being bounded by the buried layer and the collector contact regions; further comprising a common base region formed in the upper surface of the collector region including an inner contact-connected base region and an annular base region disposed around and concentrically with the inner base region, an annular emitter region disposed in said base region inside and concentrically with said annular base region, an annular barrier region formed in said base region inside said annular emitter region separating said inner base region and said annular base region, said barrier region extending downward partially into the base region, and annular barrier base-pinch resistance being formed by a space between the lower surface of said annular barrier region and the boundary between the collector region and the base region, said annular barrier resistance forming a connection between the inner contact-connected base zone and the annular base region.

2. Power transistor according to claim 1 wherein said annular barrier base-pinch resistivity has an area resistance of approximately 5 kilo-ohm/square.

3. Integrated bipolar power transistor arrangement including a plurality of parallel connected bipolar partial power transistors comprising: an epitaxial layer provided on a semiconductor substrate and forming contact connected collector regions for said partial power transistors, a buried layer region for said collector regions provided at the interface between said cemiconductor substrate and said epitaxial layer; deep diffused collector contact regions projecting downward from the surface of the epitaxial layer into the buried layer, the contact connected collector region having an upper surface and being bounded by the buried layer and the collector contact regions, comprising a common base region formed in the upper surface of the collector region, consisting of an inner contact-connected base region and a semi-toroid-shaped annular base region disposed around and concentrically with the inner base region, an annular emitter region disposed in said base region inside and concentrically with said annular base region, said annular base region completely enclosing said annular emitter region; an annular disc-shaped barrier resistance embedded in the upper surface of the base region, disposed between the annular base region and the inner contact-connected base region.

4. Power transistor according to claim 3 wherein said disc-shaped barrier resistivity has a resistance value of approximately 2 kilo-ohm/square.

5. Power transistor according to claim 4 wherein said disc-shaped barrier resistance is an implanted high-ohmic resistance.

* * * * *